(12) United States Patent
Takahashi

(10) Patent No.: US 8,339,164 B2
(45) Date of Patent: Dec. 25, 2012

(54) ANTENNA DRIVING DEVICE

(75) Inventor: Naoki Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 126 days.

(21) Appl. No.: 12/913,893

(22) Filed: Oct. 28, 2010

(65) Prior Publication Data

US 2011/0102026 A1 May 5, 2011

(30) Foreign Application Priority Data

Nov. 5, 2009 (JP) ................................. 2009-253898
Sep. 29, 2010 (JP) ................................. 2010-218511

(51) Int. Cl.
*H03K 4/94* (2006.01)
(52) U.S. Cl. ........................................................ 327/130
(58) Field of Classification Search .................... 327/130
See application file for complete search history.

(56) References Cited

U.S. PATENT DOCUMENTS

| | | | | |
|---|---|---|---|---|
| 2,207,048 A * | 7/1940 | Campbell | ...................... | 348/636 |
| 2,604,590 A * | 7/1952 | Wilson | .......................... | 327/140 |
| 3,014,213 A * | 12/1961 | Brockway, Jr. | .................. | 342/59 |
| 3,019,391 A * | 1/1962 | Lewis | ............................. | 327/134 |
| 3,955,100 A * | 5/1976 | Takahashi et al. | .............. | 377/57 |
| 4,070,550 A * | 1/1978 | Miller et al. | .................. | 370/204 |
| 5,818,265 A * | 10/1998 | Meller et al. | ...................... | 327/6 |
| 6,255,830 B1 * | 7/2001 | Rollin et al. | ................... | 324/627 |
| 7,332,943 B2 * | 2/2008 | Botti et al. | ..................... | 327/112 |
| 7,719,356 B2 * | 5/2010 | McMorrow | ................... | 330/251 |
| 2009/0322302 A1 * | 12/2009 | Fukushi | ......................... | 323/284 |
| 2011/0084739 A1 * | 4/2011 | Yu et al. | ......................... | 327/130 |

FOREIGN PATENT DOCUMENTS

| JP | 10154951 A * | 6/1998 |
|---|---|---|
| JP | 2006-279238 | 10/2006 |
| WO | WO 2007112717 A1 * | 10/2007 |

* cited by examiner

*Primary Examiner* — Lincoln Donovan
*Assistant Examiner* — William Hernandez
(74) *Attorney, Agent, or Firm* — Fish & Richardson P.C.

(57) ABSTRACT

The antenna driving device of the present invention is composed of a trapezoidal-wave signal generating circuit for generating a trapezoidal-wave signal from a reculangular-wave signal having a predetermined frequency; and a trapezoidal-wave signal amplifying circuit for amplifying the trapezoidal-wave signal and feeding the amplified signal to an antenna load.

21 Claims, 18 Drawing Sheets

FIG. 7

| PIN NO. | TERMINAL NAME | FUNCTION |
|---|---|---|
| 1 | BST | CAPACITANCE CONNECTION TERMINAL FOR STEP-UP CIRCUIT |
| 2 | CP4 | CAPACITANCE CONNECTION TERMINAL FOR STEP-UP CIRCUIT |
| 3 | CP3 | CAPACITANCE CONNECTION TERMINAL FOR STEP-UP CIRCUIT |
| 4 | CP2 | CAPACITANCE CONNECTION TERMINAL FOR STEP-UP CIRCUIT |
| 5 | CP1 | CAPACITANCE CONNECTION TERMINAL FOR STEP-UP CIRCUIT |
| 6 | XOUT | QUARTZ OSCILLATOR CONNECTION TERMINAL |
| 7 | XIN | QUARTZ OSCILLATOR CONNECTION TERMINAL |
| 8 | GND | SIGNAL UNIT GND TERMINAL |
| 9 | OUT1P | DRIVER OUTPUT TERMINAL |
| 10 | OUT1N | DRIVER OUTPUT TERMINAL |
| 11 | EN_DRV | DRIVER OUTPUT ON/OFF TERMINAL (L:STOP, H:START) |
| 12 | STBY | STAND BY ON/OFF TERMINAL (L:STANDBY, H:ENABLE) |
| 13 | ISET | RESISTANCE CONNECTION TERMINAL FOR SLOPE SETTING |
| 14 | PGND | DRIVER OUTPUT UNIT GND TERMINAL |
| 15 | DIAG | PROTECTION FUNCTION DETECTION OUTPUT TERMINAL (L:DETECTION, H:NON-DETECTION) |
| 16 | SEL_CH1 | DRIVE CHANNEL SWITCHING TERMINAL |
| 17 | SEL_CH2 | DRIVE CHANNEL SWITCHING TERMINAL |
| 18 | SEL_SW | H-BRIDGE, HALF-BRIDGE SWITCHING TERMINAL (L:HALF-BRIDGE, H:H-BRIDGE) |
| 19 | OUT2P | DRIVER OUTPUT TERMINAL |
| 20 | OUT2N | DRIVER OUTPUT TERMINAL |
| 21 | VS | DRIVER UNIT POWER SUPPLY TERMINAL |
| 22 | CS | EXTERNALLY CONNECTED FET CURRENT DETECTION TERMINAL |
| 23 | VREG | 5VREG OUTPUT FOR FET DRIVING |
| 24 | OUTG | FET GATE DRIVE TERMINAL |
| 25 | COMP | ERROR AMPLIFIER OUTPUT |
| 26 | FB | ERROR AMPLIFIER INPUT |
| 27 | VCC | POWER SUPPLY TERMINAL |
| 28 | SS | SOFT START TIME SETTING TERMINAL |

FIG. 8

| PATTERN | INPUT | | | | | OUTPUT | | | |
|---|---|---|---|---|---|---|---|---|---|
| | STBY | EN_DRV | SEL_SW | SEL_CH1 | SEL_CH2 | OUT1P | OUT1N | OUT2P | OUT2N |
| (1) | L | L | PATTERNS (3) THROUGH (8) | | | HiZ | HiZ | HiZ | HiZ |
| (2) | H | L | PATTERNS (3) THROUGH (8) | | | L | L | L | L |
| (3) | H | H | L | L | L | enable | L | L | L |
| (4) | H | H | L | H | L | L | enable | L | L |
| (5) | H | H | L | L | H | L | L | enable | L |
| (6) | H | H | L | H | H | L | L | L | enable |
| (7) | H | H | H | H | L | enable | enable | L | L |
| (8) | H | H | H | L | H | L | L | enable | enable |

ANTENNA DRIVING DEVICE

CROSS-REFERENCE TO RELATED APPLICATIONS

This application is based on Japanese Patent Application No. 2009-253898 filed on Nov. 5, 2009, and Japanese Patent Application No. 2010-218511 filed on Sep. 29, 2010, the contents of which are hereby incorporated by reference.

BACKGROUND OF THE INVENTION

1. Field of the Invention

The present invention relates to an antenna driving device used in a system (smart entry system, tire pressure monitoring system, or the like) equipped with an LF (low frequency) (e.g., 125 kHz) antenna.

2. Description of Related Art

FIG. 3 is a circuit diagram showing an example of a conventional antenna driving device, and FIG. 4 is a waveform diagram showing an example of antenna driving using a reculangular-wave signal.

The conventional antenna driving device 100 has an H-bridge output circuit composed of P-channel MOS field effect transistors 101 and 102 and N-channel MOS field effect transistors 103 and 104, and a positive-phase output signal OUTP and a negative-phase output signal OUTN (e.g., 125 kHz) having mutually opposite phases are fed to the respective terminals of an antenna load 200. At this time, the antenna load 200 having a coil L and a capacitor C is resonance driven at a predetermined resonance frequency f $(=1/(2\pi\sqrt{LC})$, where L in the equation is the inductance value of the coil L, and C is the capacitance value of the capacitor C), and a sine-wave output current Io flows through the antenna load 200.

An automobile LF antenna driving device for driving an antenna load using a sine-wave signal is disclosed/proposed in Japanese Laid-open Patent Publication No. 2006-279238 (referred to hereinafter as Patent Document 1) as an example of a conventional technique related to the technique described above.

SUMMARY OF THE INVENTION

However, in the conventional antenna driving device 100 shown in FIG. 3, since a reculangular-waveform positive-phase output signal OUTP and negative-phase output signal OUTN are fed to the antenna load 200, high-harmonic noise at the drive frequency of 125 kHz occur due to steep switching of the output logical level.

Through the conventional technique of Patent Document 1, the high-harmonic noise described above can be reduced by using a sine-wave signal to drive the antenna load. However, the conventional configuration for driving the antenna load using a sine-wave signal has other drawbacks such as increased power consumption, reduced output efficiency, and reduced reliability due to heat generation.

The present invention was developed in view of the abovementioned drawbacks discovered by the inventors, and an object of the present invention is to provide an antenna driving device capable of reducing high-harmonic noise without increased power consumption or reduced reliability due to heat generation.

In order to achieve the abovementioned objects, the antenna driving device of the present invention comprises a trapezoidal-wave signal generating circuit for generating a trapezoidal-wave signal from a reculangular-wave signal having a predetermined frequency; and a trapezoidal-wave signal amplifying circuit for amplifying the trapezoidal-wave signal and feeding the amplified signal to an antenna load.

Through the antenna driving device of the present invention, high-harmonic noise can be reduced without increased power consumption or reduced reliability due to heat generation.

Other characteristics, elements, steps, advantages, and properties of the present invention will become clear from the following detailed description of preferred embodiments, and the accompanying drawings.

BRIEF DESCRIPTION OF THE DRAWINGS

FIG. 7 is a terminal description diagram for the antenna driving device X;

FIG. 8 is an input/output logic table for the antenna driving device X;

DETAILED DESCRIPTION OF PREFERRED EMBODIMENTS

First Embodiment

Figure 1:
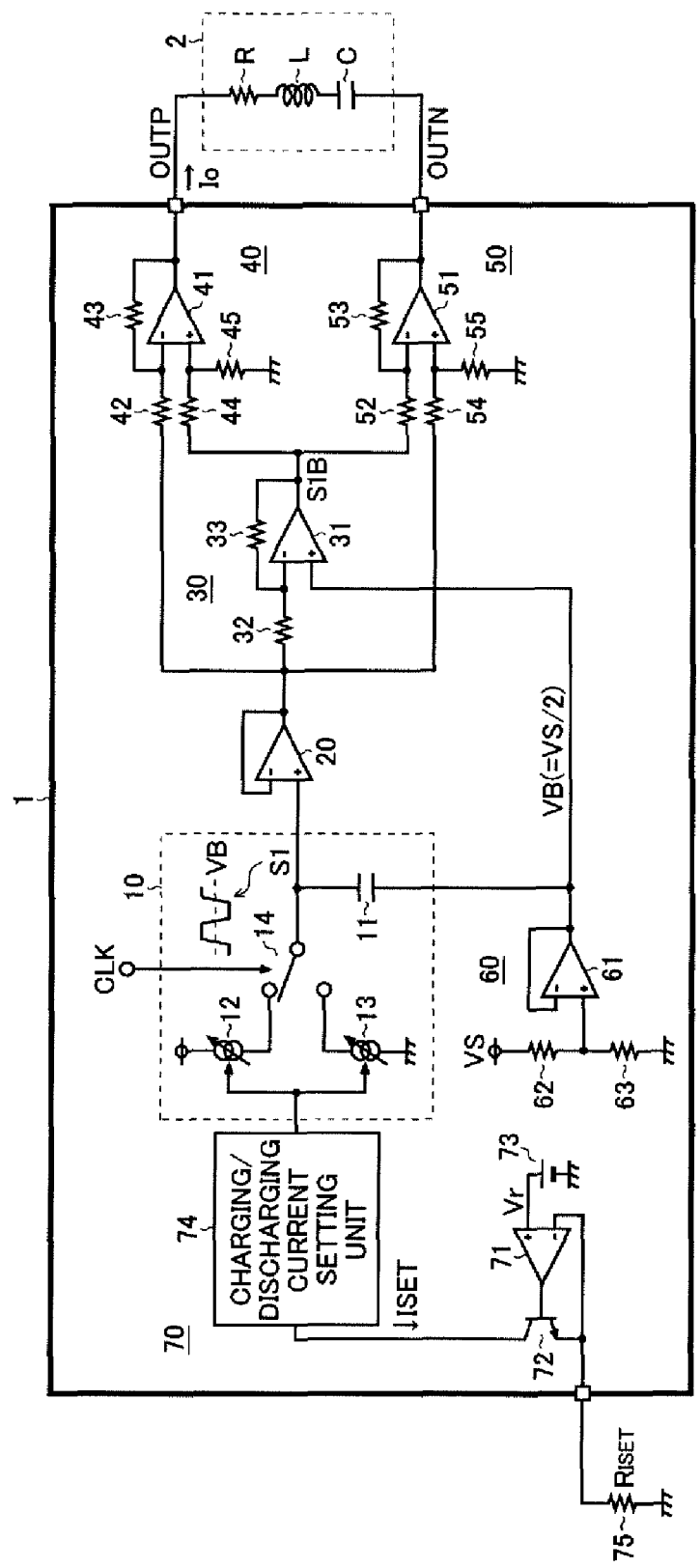
FIG. 1 is a circuit diagram showing a first embodiment of the antenna driving device according to the present invention.

FIG. 1 is a circuit diagram showing a first embodiment of the antenna driving device according to the present invention. The antenna driving device 1 of the present invention is a semiconductor device in which a trapezoidal-wave signal generating circuit 10, a buffer amplifier 20, a phase inverting circuit 30, a first differential amplifying circuit 40, a second differential amplifying circuit 50, a bias voltage generating circuit 60, and a trapezoidal-wave slope setting circuit 70 are integrated, and in which a positive-phase output signal OUTP and a negative-phase output signal OUTN having mutually opposite phases are fed to the terminals of an antenna load 2. The antenna load 2 is an LC series circuit composed of a coil L and a capacitor C, and a resistor R primarily represents a wire resistance component.

The trapezoidal-wave generating circuit 10 is a circuit for generating a trapezoidal-wave signal S1 from a reculangular-wave signal CLK having a predetermined frequency (e.g., 125 kHz), and is composed of a capacitor 11, direct-current current sources 12 and 13, and a selector 14. One terminal of the capacitor 11 is connected to a shared terminal of the selector 14. The other terminal of the capacitor 11 is connected to an output terminal of the bias voltage generating circuit 60. A first selection terminal of the selector 14 is connected to a power supply terminal via the direct-current current source 12. A second selection terminal of the selector 14 is connected to a ground terminal via the direct-current current source 13. A control terminal of the selector 14 is connected to an input terminal for the reculangular-wave signal CLK.

The buffer amplifier 20 buffer-amplifies the trapezoidal-wave signal S1 inputted from the trapezoidal-wave generating circuit 10 and outputs the buffer-amplified trapezoidal-wave signal S1 to a subsequent stage.

The phase inverting circuit 30 is a circuit for inverting the phase of the trapezoidal-wave signal S1 inputted via the buffer amplifier 20 from the trapezoidal-wave generating circuit 10, and generating an inverted trapezoidal-wave signal S1B, and is composed of an operational amplifier 31, and resistors 32 and 33. The non-inverting input terminal (+) of the operational amplifier 31 is connected to an output terminal of the bias voltage generating circuit 60. The inverting input terminal (−) of the operational amplifier 31 is connected to an output terminal of the buffer amplifier 20 via the resistor 32, and to an output terminal of the operational amplifier 31 via the resistor 33.

The first differential amplifying circuit 40 is a circuit for differentially amplifying the trapezoidal-wave signal S1 and the inverted trapezoidal-wave signal S1B and generating the positive-phase output signal OUTP, and is composed of an operational amplifier 41, and resistors 42 through 45. The non-inverting input terminal (+) of the operational amplifier 41 is connected to an output terminal of the phase inverting circuit 30 via the resistor 44, as well as to a ground terminal via the resistor 45. The inverting input terminal (−) of the operational amplifier 41 is connected to an output terminal of the buffer amplifier 20 via the resistor 42, as well as to an output terminal of the operational amplifier 41 via the resistor 43. The output terminal of the operational amplifier 41 is connected to one terminal of the antenna load 2.

The second differential amplifying circuit 50 is a circuit for differentially amplifying the trapezoidal-wave signal S1 and the inverted trapezoidal-wave signal S1B and generating the negative-phase output signal OUTN, and is composed of an operational amplifier 51, and resistors 52 through 55. In the operational amplifier 51, the non-inverting input terminal (+) is connected to an output terminal of the buffer amplifier 20 via the resistor 54, as well as to a ground terminal via the resistor 55. The inverting input terminal (−) of the operational amplifier 51 is connected to an output terminal of the phase inverting circuit 30 via the resistor 52, as well as to an output terminal of the operational amplifier 51 via the resistor 53. The output terminal of the operational amplifier 51 is connected to the other terminal of the antenna load 2.

The buffer amplifier 20, phase inverting circuit 30, first differential amplifying circuit 40, and second differential amplifying circuit 50 described above function as a trapezoidal-wave signal amplifying circuit for amplifying the trapezoidal-wave signal S1 inputted from the trapezoidal-wave generating circuit 10, generating the positive-phase output signal OUTP and negative-phase output signal OUTN having mutually opposite phases, and feeding the positive-phase output signal OUTP and negative-phase output signal OUTN to the respective terminals of the antenna load 2.

The bias voltage generating circuit 60 is a circuit for generating a bias voltage VB of the trapezoidal-wave signal S1, and is composed of a buffer amplifier 61, and resistors 62 and 63. The resistors 62 and 63 are connected in series between a ground terminal and the application terminal for the power supply voltage VS, and the bias voltage VB extracted from the connection node of the resistors 62 and 63 is outputted to the other terminal of the capacitor 11 via the buffer amplifier 61, and to the non-inverting input terminal (+) of the operational amplifier 31. In a case in which the resistance values of the resistors 62 and 63 are set so as to be the same, the value of the bias voltage VB is VS/2.

The trapezoidal-wave slope setting circuit 70 is a circuit for variably setting the slope (rising rate and falling rate) of the trapezoidal-wave signal S1 generated by the trapezoidal-wave generating circuit 10, and is composed of an operational amplifier 71, an npn-type bipolar transistor 72, a direct-current voltage source 73 (electromotive voltage: Vr), a charging/discharging current setting unit 74, and an external resistor 75 (resistance value: Riser). The non-inverting input terminal (+) of the operational amplifier 71 is connected to the positive terminal (application terminal for the reference voltage Vr) of the direct-current voltage source 73. The negative terminal of the direct-current voltage source 73 is connected to a ground terminal. The inverting input terminal (−) of the operational amplifier 71 is connected to an emitter of the transistor 72. An output terminal of the operational amplifier 71 is connected to the base of the transistor 72. The emitter of the transistor 72 is connected to a ground terminal via the external resistor 75. The collector of the transistor 72 is connected to a reference current input terminal of the charging/discharging current setting unit 74. The charging/discharging current setting unit 74 variably sets the charging/discharging current of the capacitor 11 on the basis of a slope setting current ISET ($=Vr/R_{ISET}$) which flows to the external resistor 75.

The operation of the antenna driving device 1 configured as described above will next be described in detail with reference to FIG. 2.

Figure 2:
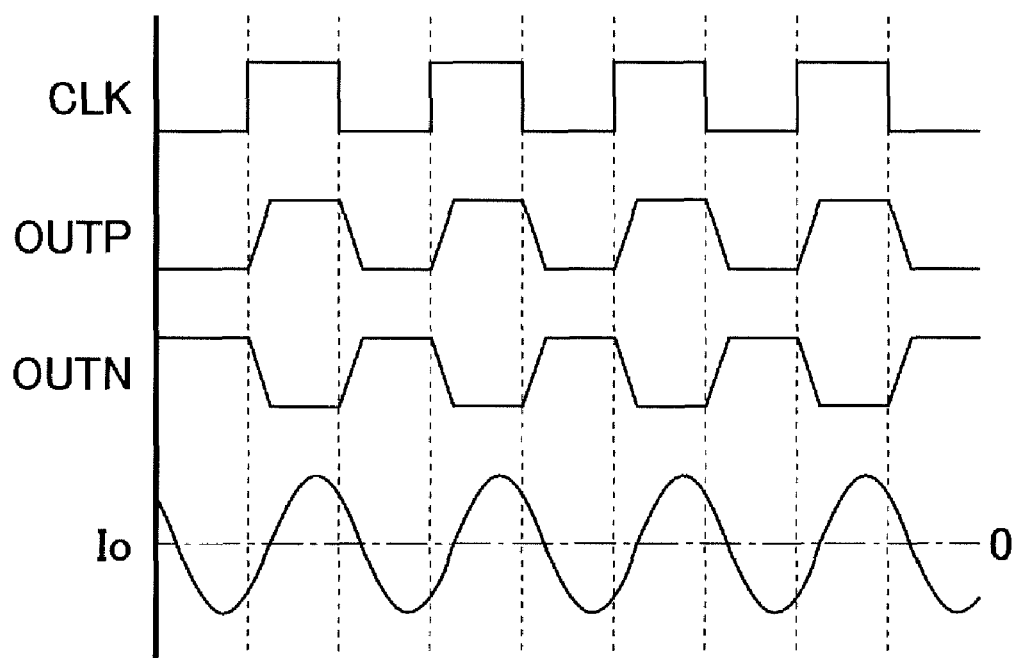
FIG. 2 is a waveform diagram showing an example of antenna driving by a trapezoidal-wave signal.
Figure 3:
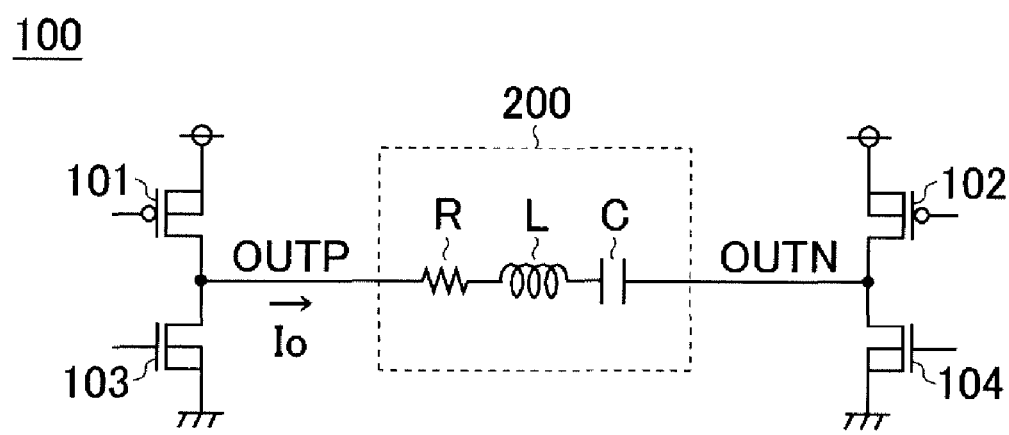
FIG. 3 is a circuit diagram showing an example of a conventional antenna driving device.
Figure 4:
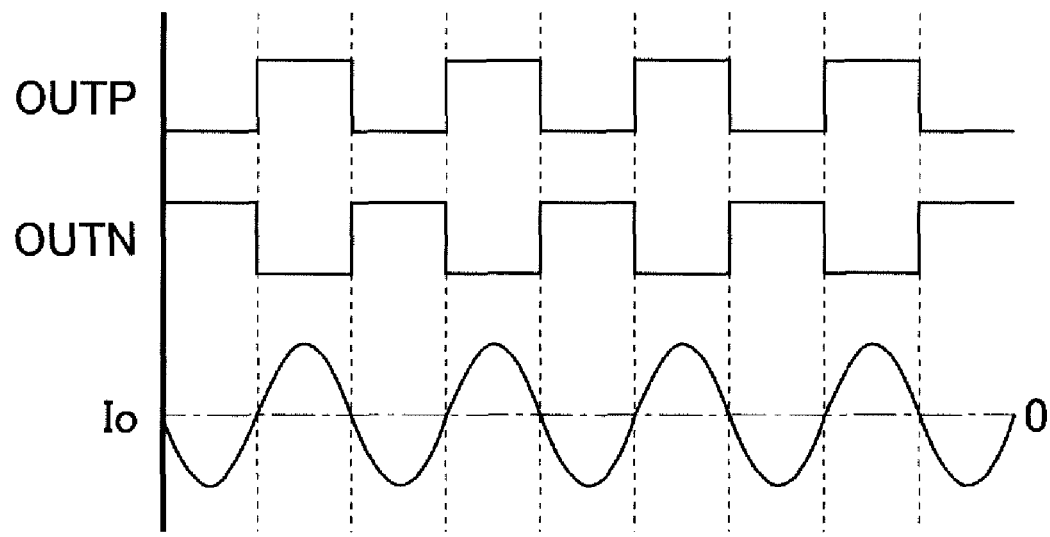
FIG. 4 is a waveform diagram showing an example of antenna driving by a reculangular-wave signal.

FIG. 2 is a waveform diagram showing an example of antenna driving by a trapezoidal-wave signal, and shows, in order from the top, the reculangular-wave signal CLK, the positive-phase output signal OUTP, the negative-phase output signal OUTN, and the output current Io.

In the trapezoidal-wave generating circuit 10, the selector 14 conducts between a first selection terminal and a shared terminal when the reculangular-wave signal CLK is high-level, and conducts between a second selection terminal and the shared terminal when the reculangular-wave signal CLK is low-level. Specifically, when the reculangular-wave signal CLK is high-level, a charging current is inserted to the capacitor 11 from the direct-current current source 12. As a result, the trapezoidal-wave signal S1 is raised to a predetermined voltage level ($=VB+\alpha$) at a slope determined by the size of the charging current. When the reculangular-wave signal CLK is low-level, a discharging current is extracted from the capacitor 11 by the direct-current current source 13. As a result, the trapezoidal-wave signal S1 is lowered to a predetermined voltage level ($=VB-\alpha$) at a slope determined by the size of the discharging current. Specifically, the trapezoidal-wave signal S1 is driven at a predetermined amplitude α (e.g., ±1.5 V) with the bias voltage VB as a reference. The trapezoidal-wave generating circuit 10 thus generates the trapezoidal-wave signal S1 by charging and discharging the capacitor 11 in accordance with the reculangular-wave signal CLK.

The buffer amplifier 20 buffer-amplifies the trapezoidal-wave signal S1 inputted from the trapezoidal-wave generating circuit 10 and outputs the buffer-amplified trapezoidal-wave signal S1 to a subsequent stage, and the phase inverting circuit 30 inverts the phase of the trapezoidal-wave signal S1 inputted via the buffer amplifier 20 from the trapezoidal-wave generating circuit 10 and generates the inverted trapezoidal-wave signal S1B. The inverted trapezoidal-wave signal S1B generated by the phase inverting circuit 30 is driven at a predetermined amplitude α (e.g., ±1.5 V) with the bias voltage VB as a reference, in the same manner as the trapezoidal-wave signal S1 generated by the trapezoidal-wave generating circuit 10.

The first differential amplifying circuit 40 and the second differential amplifying circuit 50 differentially amplify the trapezoidal-wave signal S1 and the inverted trapezoidal-wave signal S1B, respectively, generate the positive-phase output signal OUTP and the negative-phase output signal OUTN, and feed the positive-phase output signal OUTP and negative-phase output signal OUTN to the respective terminals of the antenna load 2. At this time, the antenna load 2 having the coil L and capacitor C is resonance driven at a predetermined resonance frequency f (=1/(2π√LC), where L in the equation is the inductance value of the coil L, and C is the capacitance value of the capacitor C), and a sine-wave output current Io flows.

Thus, in the antenna driving device 1 of the present embodiment, since the reculangular-wave positive-phase output signal OUTP and negative-phase output signal OUTN are fed to the antenna load 2, steep switching of the output logical level can be eliminated, and high-harmonic noise can be reduced.

Through the antenna driving device 1 of the present embodiment, increased power consumption, reduced output efficiency, reduced reliability due to heat generation, and other problems can be suppressed in comparison to the conventional configuration in which a sine-wave signal is used to drive the antenna load.

Furthermore, through the antenna driving device 1 of the present embodiment, compared with the conventional configuration in which a sine-wave signal is used to drive the antenna load, there is no need to take reduced output efficiency into account, and there is therefore no need to increase the bias voltage VB of the trapezoidal-wave signal S1.

In the antenna driving device 1 of the present embodiment, in the first differential amplifying circuit 40, the inverted trapezoidal-wave signal S1B is inputted to the non-inverting input terminal (+) of the operational amplifier 41, and the trapezoidal-wave signal S1 is inputted to the inverting input terminal (−) of the operational amplifier 41. In the second differential amplifying circuit 50, the trapezoidal-wave signal S1 is inputted to the non-inverting input terminal (+) of the operational amplifier 51, and the inverted trapezoidal-wave signal S1B is inputted to the inverting input terminal (−) of the operational amplifier 51. Consequently, the positive-phase output signal OUTP generated by the first differential amplifying circuit 40, and the negative-phase output signal OUTN generated by the second differential amplifying circuit 50 have mutually opposite phases. By employing such a differential output format, in comparison with a configuration in which only one of the output signals is used to drive the antenna load 2, the voltage applied across both terminals of the antenna load 2 can be increased by a factor of 2, and the output capability of the antenna load 2 can therefore be strengthened.

The operation of the trapezoidal-wave slope setting circuit 70 will next be described in detail.

In the trapezoidal-wave slope setting circuit 70, the operational amplifier 71 controls the degree of conduction of the transistor 72 so that the voltage of one terminal of the external resistor 75 matches the reference voltage Vr of the direct-current voltage source 73. Consequently, a predetermined slope setting current ISET (=Vr/$R_{ISET}$) flows to the external resistor 75. The charging/discharging current setting unit 74 sets the charging/discharging current of the capacitor 11 on the basis of the slope setting current ISET. Specifically, a user can variably set the slope of the trapezoidal-wave signal S1 by arbitrarily adjusting the resistance value of the external resistor 75. By adopting such a configuration, a user taking into consideration the balance between noise characteristics and power consumption can optimize both sets of characteristics in accordance with the application of the antenna driving device 1 or the specifications of the system in which the antenna driving device 1 is mounted.

Figure 5:
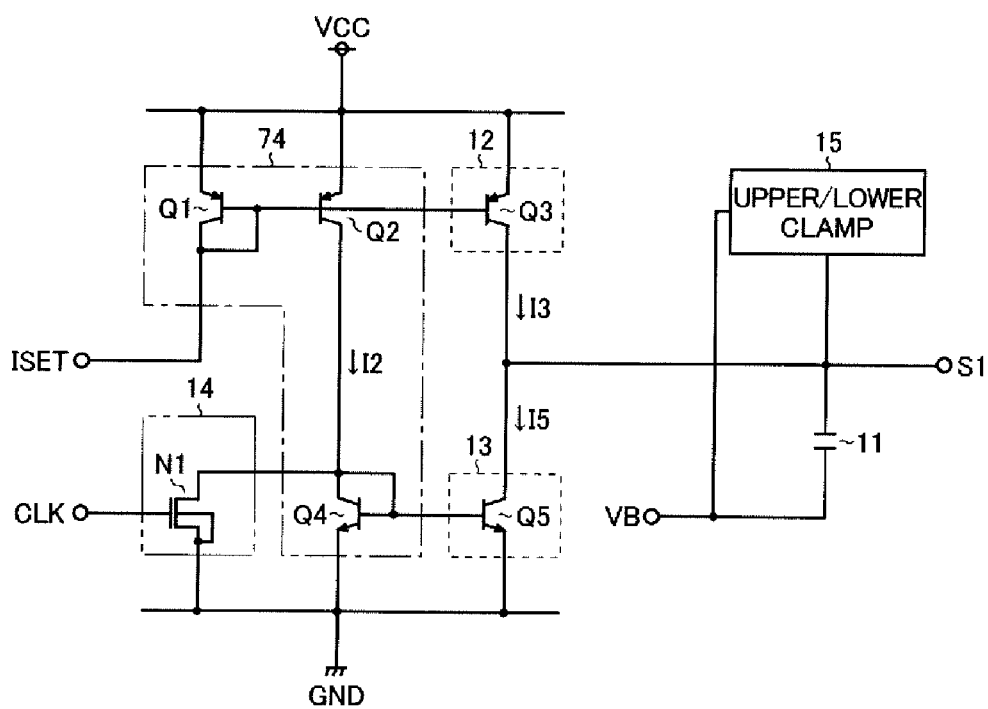
FIG. 5 is a circuit diagram showing the specific configuration of the charging/discharging current unit 74 and the trapezoidal-wave generating circuit 10.

The specific circuit structure of the charging/discharging current setting unit 74 and the trapezoidal-wave generating circuit 10 will next be described in detail with reference to FIG. 5. FIG. 5 shows pnp-type bipolar transistors Q1 through Q3, npn-type bipolar transistors Q4 and Q5, and an N-channel MOS field effect transistor N1 as circuit elements for forming the charging/discharging current setting unit 74 and the trapezoidal-wave generating circuit 10. FIG. 5 also shows a upper/lower clamp 15 for setting the upper-limit value (=VB+α) and the lower-limit value (=VB−α) of the trapezoidal-wave signal S1 with the bias voltage VB as a reference.

The emitters of the transistors Q1 through Q3 are all connected to the application terminal for the power supply voltage VCC. The bases of the transistors Q1 through Q3 are all connected to the collector of the transistor Q1. The collector of the transistor Q1 is connected to an input terminal of the slope setting current ISET. The collector of the transistor Q2 is connected to the collector of the transistor Q4. The collectors of the transistors Q3 and Q5 are both connected to the output terminal for the trapezoidal-wave signal S1. The bases of the transistors Q4 and Q5 are both connected to the collectors of the transistor Q4. The drains of the transistors Q4 and Q5 are both connected to a ground terminal. The drain of the transistor N1 is connected to the collector of the transistor Q4. The source and back gate of the transistor N1 are both connected to the ground terminal. The gate of the transistor N1 is connected to an input terminal for the reculangular-wave signal CLK.

The transistors Q1 through Q3 form a first current mirror, and the mirror current I2 flowing to the transistor Q2 and the mirror current I3 flowing to the transistor Q3 each vary according to the slope setting current ISET which flows to the transistor Q1. The transistors Q4 and Q5 form a second current mirror, and the mirror current I5 flowing to the transistor Q5 varies according to the mirror current I2 (and consequently the slope setting current ISET flowing to the transistor Q1) flowing from the transistor Q2 to the transistor Q4.

The mirror current I3 corresponds to the charging current of the capacitor 11, and the difference current (=I5−I3) obtained by subtracting the mirror current I3 from the mirror current I5 corresponds to the discharging current of the capacitor 11. Specifically, a transistor Q13 functions as the direct-current current source 12 of FIG. 1, and the transistor Q5 functions as the direct-current current source 13 of FIG. 1.

The transistors Q1, Q2, Q4 function as the charging/discharging current setting unit 74 of FIG. 1.

When the reculangular-wave signal CLK is high-level, the transistor N1 switches on, and the mirror current I2 flows to the ground terminal via the transistor N1. A current therefore no longer flows into the transistor Q4, and consequently, a current also no longer flows to the transistor Q5. At this time, the mirror current I3 is injected as a charging current from the transistor Q3 to the capacitor 11. On the other hand, when the reculangular-wave signal CLK is low-level, since the transistor N1 switches on, and the mirror current I2 flows into the transistor Q4, a current also no longer flows to the transistor Q5. At this time, the mirror current I5 flowing to the transistor Q5 is set to a larger value (e.g., twice the value of the mirror current I3) than the mirror current I3 flowing to the transistor Q3. Consequently, the difference current (=I5−I3) obtained by subtracting the mirror current I3 from the mirror current I5 is extracted as a discharging current from the capacitor 11. The transistor N1 thus functions as the selector 14 of FIG. 1.

Second Embodiment

Figure 6:
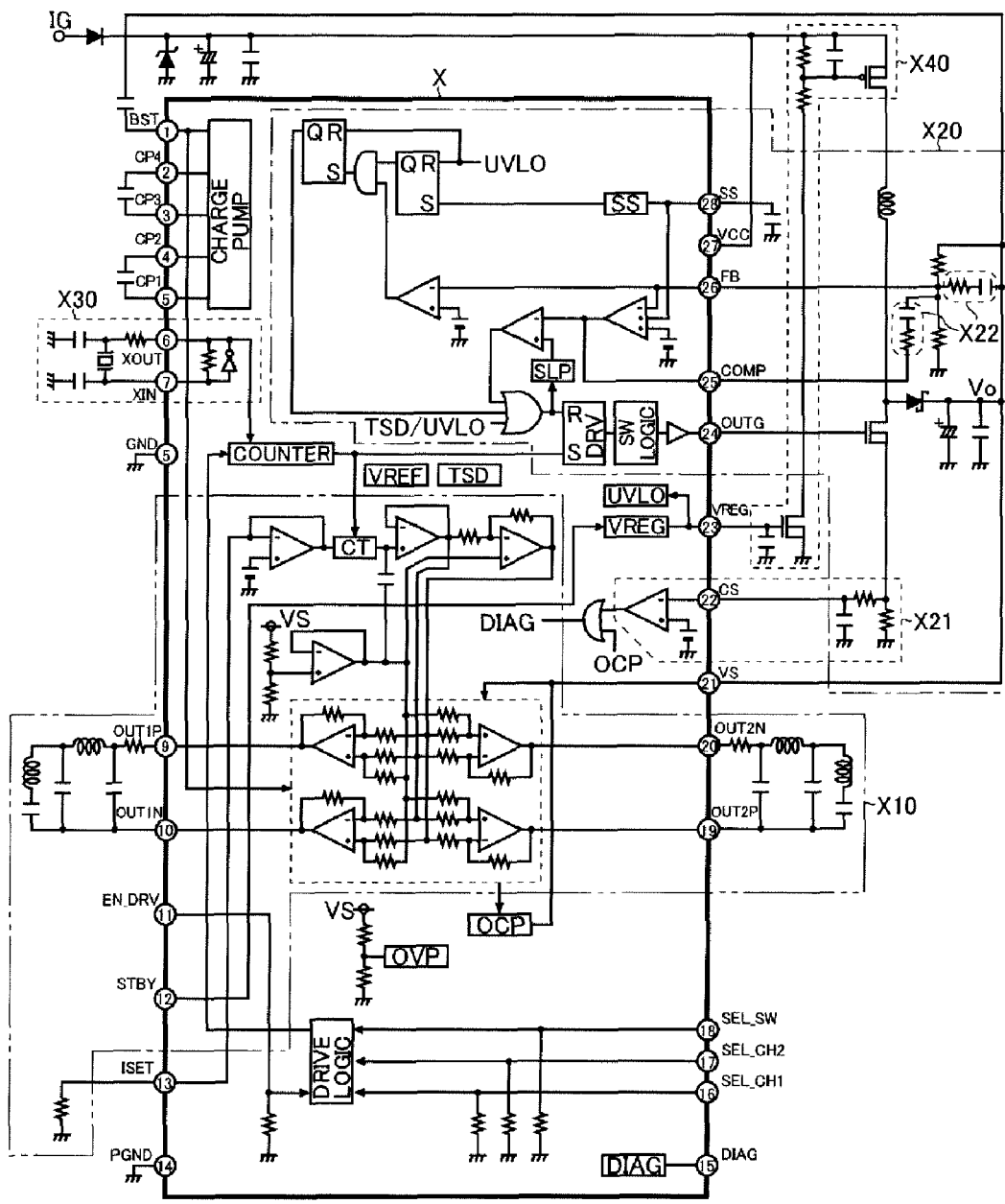
FIG. 6 is a circuit diagram showing a second embodiment of the antenna driving device according to the present invention.

FIG. 6 is a circuit diagram showing a second embodiment of the antenna driving device according to the present invention. The antenna driving device X of the present embodiment is a semiconductor device having an antenna driving circuit X10, a power supply circuit X20, an oscillating circuit X30, and a power supply protection circuit X40.

The antenna driving circuit X10 is a circuit block for receiving an output voltage Vo fed from the power supply circuit X20 and driving an antenna load, and is the same that of the first embodiment described above as far as including a trapezoidal-wave signal generating circuit for generating a trapezoidal-wave signal from a reculangular-wave signal having a predetermined frequency, and a trapezoidal-wave signal amplifying circuit for amplifying the trapezoidal-wave signal and feeding the amplified trapezoidal-wave signal to the antenna load.

The power supply circuit X20 is a circuit block for generating the desired output voltage Vo from an input voltage VCC inputted from an IG terminal, and in the example shown in FIG. 6, a step-up switching DC/DC converter is used as the power supply circuit X20. The output feedback loop included in the power supply circuit X20 has a common circuit configuration using an error amplifier, a pulse width modulation (PWM) comparator, a slope voltage generator (SLP), an RS flip-flop, a switch logic unit, a driver, and other components, and therefore will not be described in detail.

The power supply circuit X20 also includes an overcurrent protection circuit X21 and a phase compensating circuit X22.

The overcurrent protection circuit X21 has a CS terminal (pin 22) for detecting a current that flows to an external FET of an output stage, and when the CS terminal voltage is equal to or above a predetermined value (e.g., 100 mV), the overcurrent protection circuit X21 reduces the duty of the switching output and lowers the output voltage Vo. When the output voltage Vo reaches 70% or less of a set voltage, the switching output is latched off. In order to release this off-latched state, a standby signal STBY is temporarily set to the low level.

The phase compensating circuit X22 performs phase compensation of the output feedback loop, and includes a resistor and capacitor for phase compensation. The method of phase compensation for the error amplifier will be described in detail hereinafter.

The oscillating circuit X30 uses an external quartz oscillator to generate the reculangular-wave signal CLK.

The power supply protection circuit X40 is a circuit block for preventing malfunctioning of the power supply circuit X20 when the internal power supply voltage VREG is low. When the internal power supply voltage VREG decreases to a voltage lower than normal, an NMOS connected to an OUTG terminal (pin 23) switches off, and as a result, a PMOS connected between an application terminal for the input voltage VCC and a coil forming the output stage of the power supply circuit X20 switches off, and the input voltage VCC is no longer fed to the power supply circuit X20.

The abovementioned antenna driving circuit X10, power supply circuit X20, oscillating circuit X30, and power supply protection circuit X40, as well as a charge pump circuit, an internal power supply voltage generating circuit (VREG), a reference voltage generating circuit (VREF), a counter circuit, a drive logic circuit, a temperature protection circuit (TSD (thermal shut-down)), an overcurrent protection (OCP) circuit, an overvoltage protection (OVP) circuit, an undervoltage protection circuit (UVLO (under voltage locked out)), an abnormal signal output circuit (DIAG), and other components are integrated in the antenna driving device X.

The temperature protection circuit is a circuit block for preventing heat damage to the antenna driving device X. The antenna driving device X is preferably used within an allowable loss range, but in the event of a continued state exceeding the allowable loss, the junction temperature (Tj) increases, and the temperature protection circuit activates to switch off an output power terminal. When the junction temperature (Tj) subsequently decreases, the circuit is automatically restored. Since the temperature protection circuit operates in states in which the absolute maximum rating is exceeded, set design and the like using the temperature protection circuit is to be avoided.

The overcurrent protection circuit is a circuit block for preventing damage in cases in which an overcurrent flows to the output due to output short circuiting or the like. The driver output terminals (OUT1P, OUT1N, OUT2P, OUT2N) are latched off when a current of a predetermined value (e.g., 2.7 A) flows for a predetermined time (e.g., 1 μsec), and the output is fixed in a high-impedance state. The abovementioned off-latching is released by temporarily setting the standby signal STBY to the low level.

The overvoltage protection circuit is a circuit block for preventing damage to internal elements when the output voltage Vo of the power supply circuit X20 increases beyond a set voltage, or an overvoltage is otherwise applied to the driver unit power supply terminal VS (pin 21). Specifically, when the VS terminal voltage reaches or exceeds a predetermined protection level (e.g., 25 V), the output logic of an OUTG terminal (pin 24) changes to low-level, and the power supply circuit X20 is stopped. When the voltage occurring in the VS terminal (pin 21) is equal to or lower than a predetermined protection release level (e.g., 24 V), the power supply circuit X20 returns to normal operation.

The undervoltage protection circuit is a circuit block for preventing malfunctioning when the power supply voltage VCC is reduced. When the internal power supply voltage VREG generated from the power supply voltage VCC is equal to or lower than a predetermined protection level (e.g., 2.7 V), the OUTG terminal (pin 24) is fixed at low-level and placed in an output high-impedance state. When the internal power supply voltage VREG is equal to or higher than a predetermined protection release level (e.g., 2.81 V), the undervoltage protection circuit returns to normal operation.

The abnormal signal output circuit (DIAG) outputs a high level during normal operation, and when any of the temperature protection circuit, the overcurrent protection circuit, the overvoltage protection circuit, and the undervoltage protection circuit are activated, the abnormal signal output circuit (DIAG) outputs a low level.

The internal power supply voltage generating circuit is a circuit block for generating the internal power supply voltage VREG (e.g., 5 V) from the power supply voltage VCC. Since the internal power supply voltage VREG sometimes fluctuates during switching operation of the power supply circuit X20, a 0.1 µF or higher capacitor is preferably connected between the VREG terminal and the GND terminal. Since the internal power supply voltage VREG is set to low-level output when the overcurrent protection circuit is activated, this output can be diverted as an overcurrent detection signal. However, since the internal power supply voltage generating circuit does not have the capability of extracting a current during standby (VREG=L), when a configuration is adopted in which a current flows in through the circuit connected to the VREG terminal, there is a risk of the internal power supply voltage VREG rising, and care must therefore be taken.

The drive logic circuit sets the drive channel and driving scheme of the antenna driving circuit X10 in accordance with the input signals from a SEL_SW terminal, a SEL_CH1 terminal, and a SEL_CH2 terminal. The driving scheme of the antenna driving circuit X10 can be arbitrarily switched between an H-bridge driving scheme (SEL_SW=H) and a half-bridge driving scheme (SEL_SW=L).

FIG. 7 is a terminal description diagram for the antenna driving device X, and shows the pin numbers and the terminal names and functions. Pin 1 (BST), pin 2 (CP4), pin 3 (CP3), pin 4 (CP2), and pin 5 (CP1) are all capacitance connection terminals for the step-up circuit (charge pump). Pin 6 (XOUT) and pin 7 (XIN) are both quartz oscillator connection terminals. Pin 8 (GND) is the GND terminal for the signal unit. Pin 9 (OUT1P) and pin 10 (OUT1N) are driver output terminals of the first channel. Pin 11 (EN_DRV) is a driver output on/off terminal (L: stop, H: start). Pin 12 (STBY) is a standby on/off terminal (L: standby, H: enable). Pin 13 (ISET) is a resistor connection terminal for slope setting. Pin 14 (PGND) is a GND terminal for the driver output unit. Pin 15 (DIAG) is a protection function detection output terminal (L: detection, H: non-detection). Pin 16 (SEL_CH1) and pin 17 (SEL_CH2) are both drive channel switching terminals. Pin 18 (SEL_SW) is a terminal for switching between H-bridge and half-bridge (L: half-bridge, H: H-bridge). Pin 19 (OUT2P) and pin 20 (OUT2N) are both driver output terminals of the second channel. Pin 21 (VS) is a driver unit power supply terminal. Pin 22 (CS) is a current detection terminal for the externally connected FET. Pin 23 (VREG) is a 5VREG output terminal for driving the FET. Pin 24 (OUTG) is a FET gate drive terminal. Pin 25 (COMP) is an error amplifier output terminal. Pin 26 (FB) is an error amplifier input terminal. Pin 27 (VCC) is a power supply terminal. Pin 28 (SS) is a soft start time setting terminal.

FIG. 8 is an input/output logic table for the antenna driving device X, and shows the pattern numbers (1) through (8), the input logic (STBY, EN_DEV, SEL_SW, SEL_CH1, SEL_CH2), and the output logic (OUT1P, OUT1N, OUT2P, OUT2N).

Figure 9:
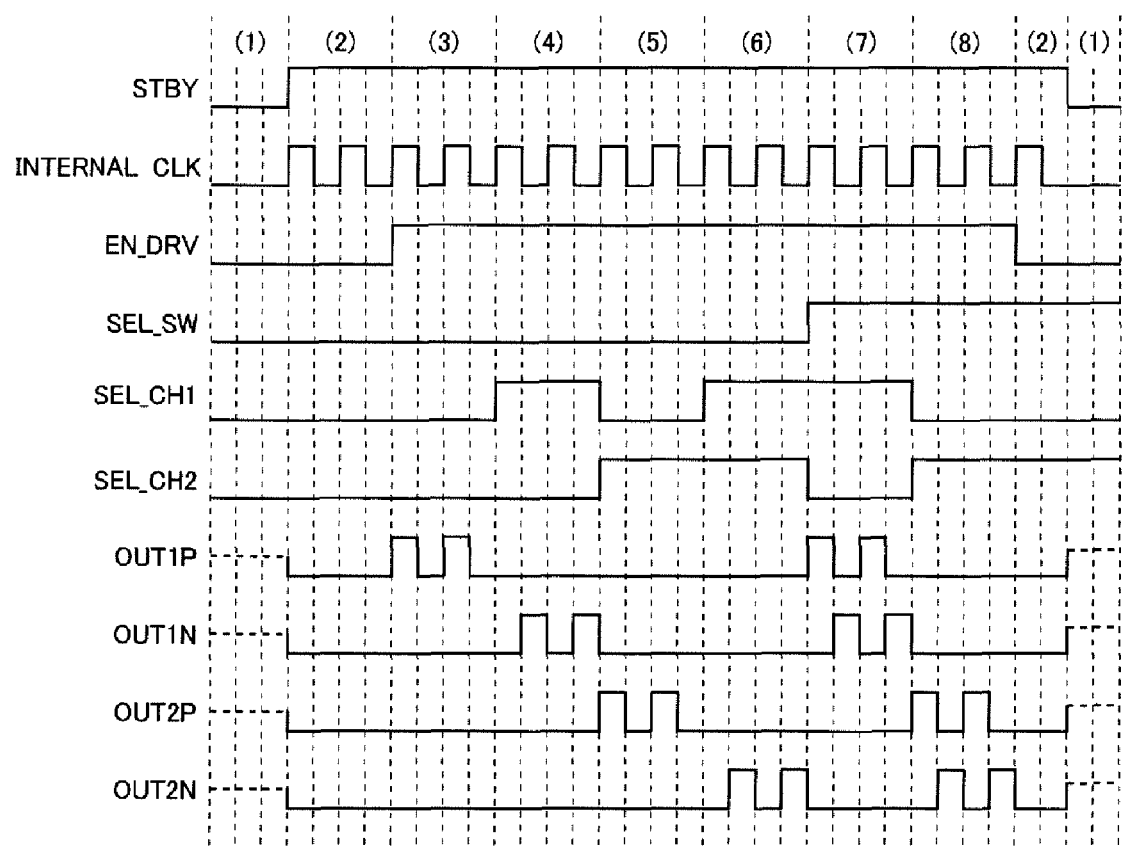
FIG. 9 is an input/output timing chart for the antenna driving device X.

FIG. 9 is an input/output timing chart for the antenna driving device X showing, in order from the top, the STBY, internal CLK, EN_DRV, SEL_SW, SEL_CH1, SEL_CH2, OUT1P, OUT1N, OUT2P, and OUT2N. The reference numerals (1) through (8) in FIG. 9 correspond to the patterns (1) through (8) in FIG. 8.

Figure 10:
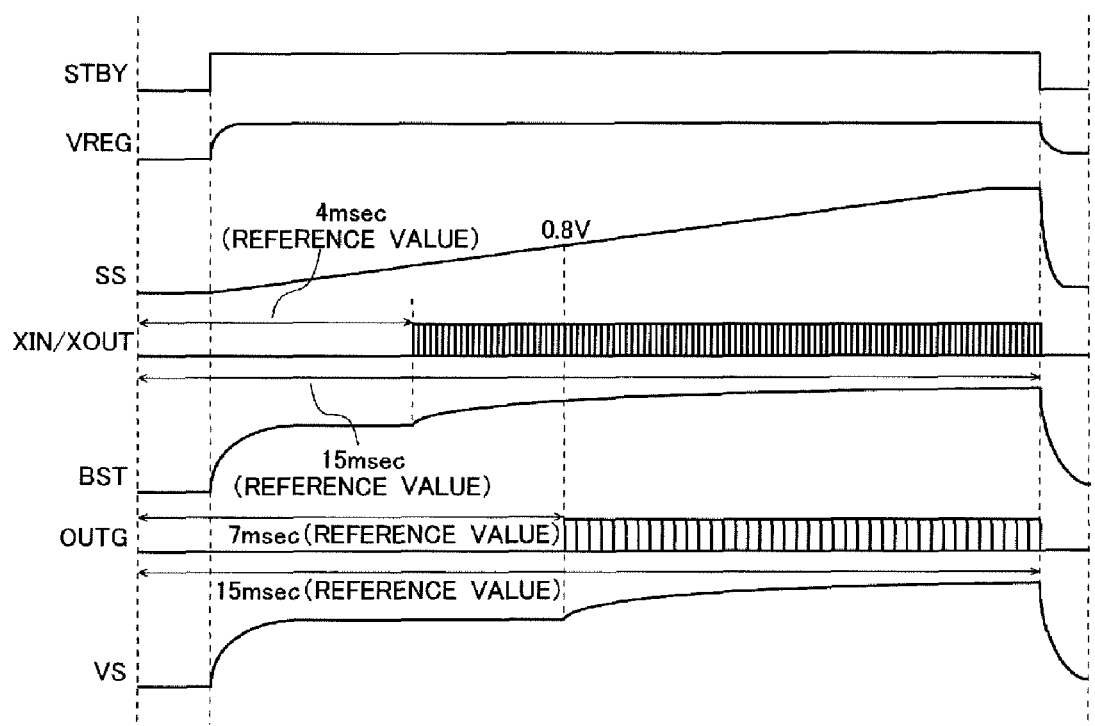
FIG. 10 is a start/stop timing chart for the switching controller unit.

FIG. 10 is a start/stop timing chart for the switching controller unit in the power supply circuit X20 and shows, in order from the top, the STBY, VREG, SS, XIN/XOUT, BST, OUTG, and VS.

Figure 11:
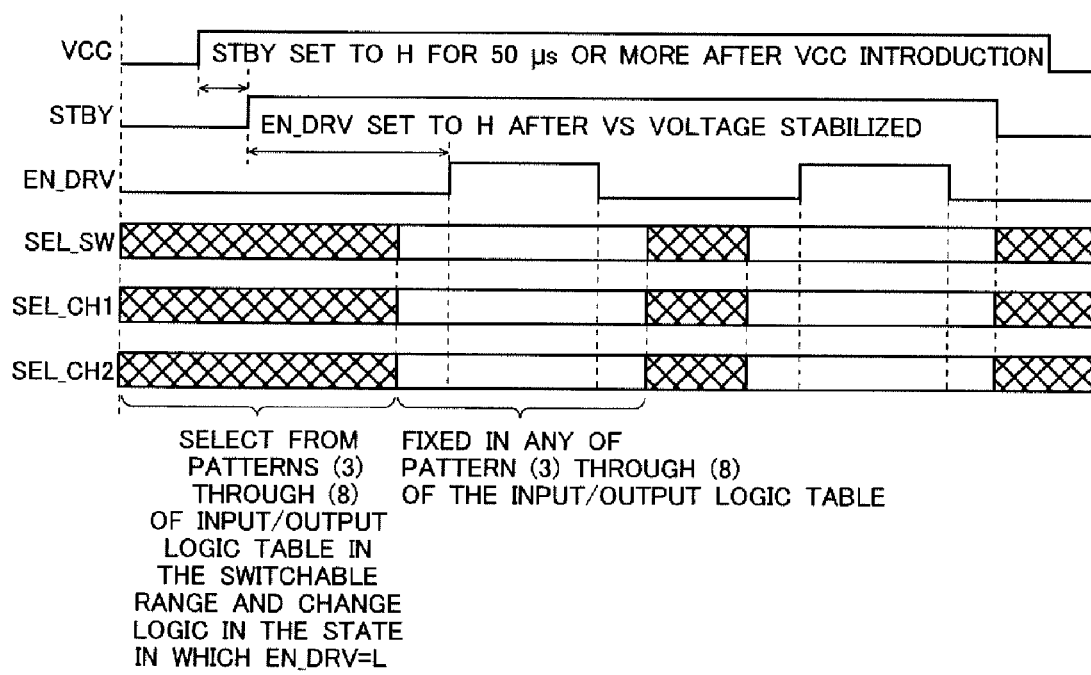
FIG. 11 is a start/stop/output logical switch timing chart for the driver unit.

FIG. 11 is a start/stop/output logical switch timing chart for the driver unit in the antenna driving circuit X10 and shows, in order from the top, the VCC, STBY, EN_DRV, SEL_SW, SEL_CH1, and SEL_CH2. After the VCC is introduced, the STBY terminal is set to high-level and output operation of the power supply circuit X20 is allowed for a predetermined time (e.g., 50 µsec) or longer. Then, after the output voltage Vo (=VS terminal voltage) has stabilized, the EN_DEV is set to high-level. Specifically, output operation of the antenna driving circuit X10 is allowed after the output voltage Vo has stabilized. During the period in which EN_DRV is high-level, SEL_SW, SEL_CH1, and SEL_CH2 should be fixed to any of the patterns (3) through (8) shown in FIG. 8, and preferably, a predetermined margin period is provided before and after the high-level period of EN_DRV, as shown in FIG. 11, and the timing for which SEL_SW, SEL_CH1 and SEL_CH2 are switchable is limited. The driving scheme and drive channel of the antenna driving circuit X10 are thus preferably established by the time output operation thereof is allowed.

Figure 12:
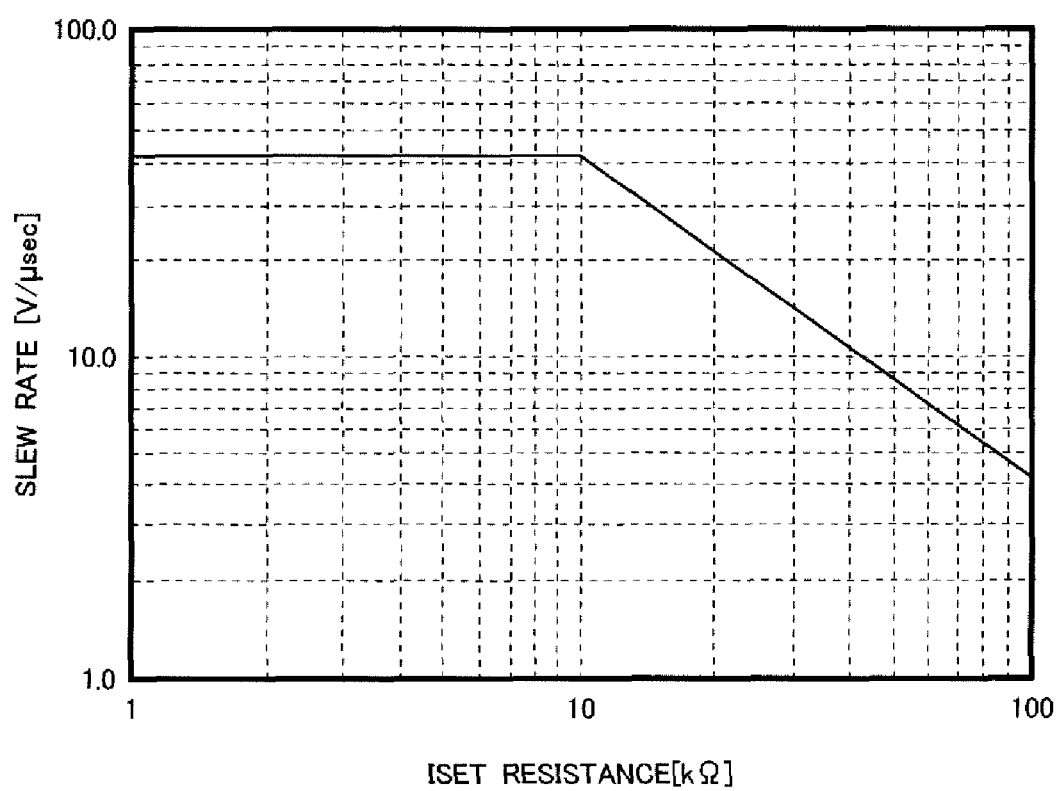
FIG. 12 is a correlation diagram for the ISET resistance and the through rate.

FIG. 12 is a correlation diagram for the external resistance (kΩ) connected to the ISET terminal, and the slew rate (V/µsec) of the trapezoidal-wave signal. The antenna driving circuit X10 is thus capable of variably setting the slope of the trapezoidal-wave signal on the basis of the external resistance connected to the ISET terminal.

Figure 13:
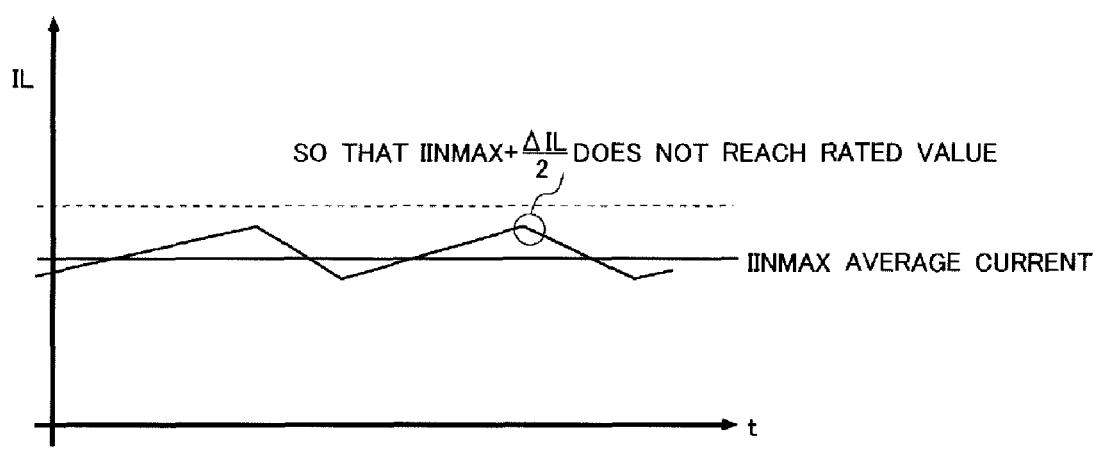
FIG. 13 is a coil current waveform diagram showing the method for setting the coil L constant.
Figure 14:
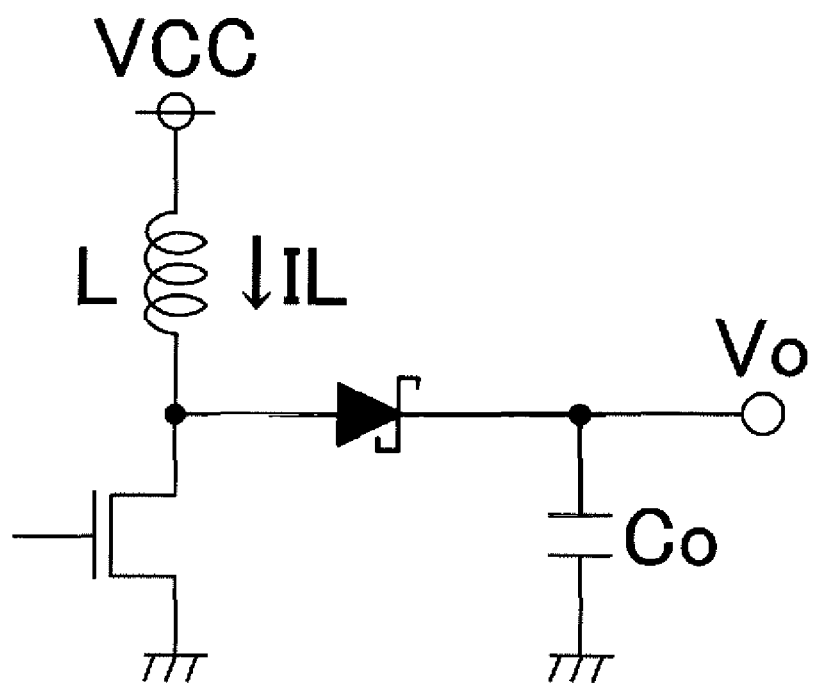
FIG. 14 is a circuit diagram showing an example of the output stage of the power supply circuit X20.

FIG. 13 is a coil current waveform diagram showing the method for setting the coil L constant, and FIG. 14 is a circuit diagram showing an example of the output stage of the power supply circuit X20. In the power supply circuit X20, the coil constant is preferably set so that IINMAX+$\Delta$IL/2<ILR is satisfied, where $\Delta$IL (=(1/L)×VCC×(Vo−VCC)/Vo×(1/f), where f is the switching frequency) is the ripple component of the current flowing to the coil of the output stage, ILR is the rated current, and IINMAX is the input current maximum value.

Figure 15:
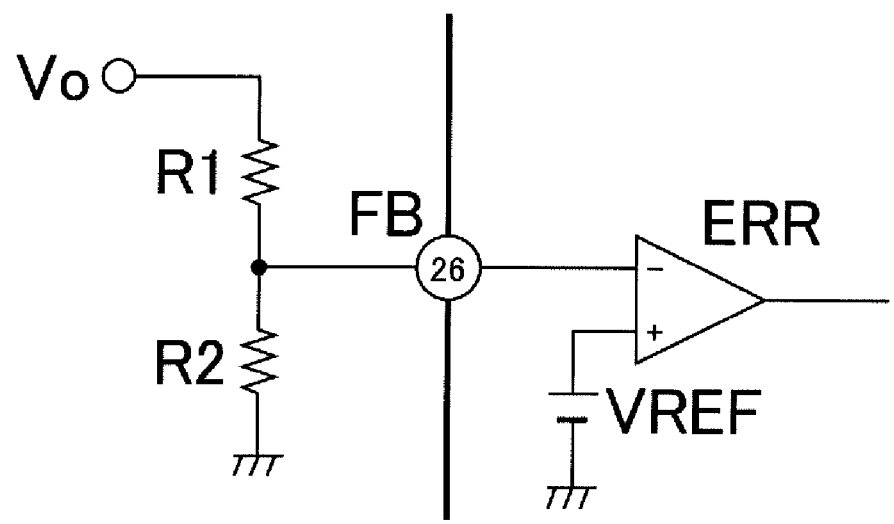
FIG. 15 is a circuit diagram showing the method for setting the feedback resistance.

FIG. 15 is a circuit diagram showing the method for setting the feedback resistance connected to the error amplifier of the power supply circuit X20. The resistance values R1, R2 of the feedback resistance are set so that Vo=(R1+R2)/R2×VREF. By adopting such settings, the output voltage Vo is generated by the power supply circuit X20 so that the feedback voltage FB (={R2/(R1+R2)}×Vo) obtained by resistance-dividing the output voltage Vo matches the predetermined reference voltage (=VREF).

The method for setting phase compensation in the output feedback loop of the power supply circuit X20 will next be described in detail. As a stability condition of the output feedback loop, the phase lag at a gain of 1 (0 dB) is 150° or less (i.e., a phase margin of 30° or greater). Since sampling occurs according to the switching frequency in the power supply circuit X20, the GBW of the overall system is preferably set to 1/10 or less of the switching frequency. In summary, the target characteristics for the power supply circuit X20 are that (1) the phase lag at a gain of 1 (0 dB) is 150° or less (i.e., a phase margin of 30° or greater), and that (2) the GBW (i.e., the frequency at a gain of 0 dB) at this time is 1/10 or less of the switching frequency.

Since the response is determined by the limitation of the GBW in the power supply circuit X20, the switching frequency must be increased in order to enhance the response. In order to ensure stability through phase compensation, the secondary phase lag (−180°) due to LC resonance must be cancelled out by secondary phase lead (i.e., by inserting two phase leads).

Since the GBW (frequency when the gain is 0 dB) of the power supply circuit X20 is determined by a phase compensation capacitance imparted to the error amplifier, the GBW may be lowered by increasing the phase compensation capacitance.

Figure 16:
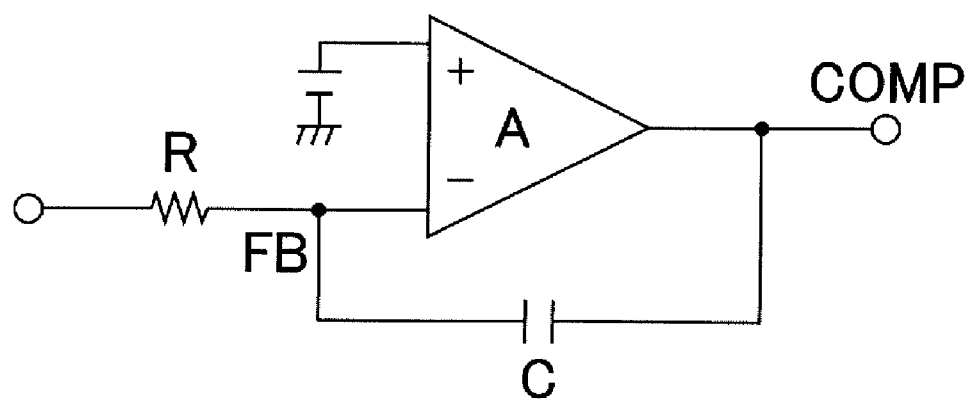
FIG. 16 is a circuit diagram showing a common integrator (low-pass filter)
Figure 17:
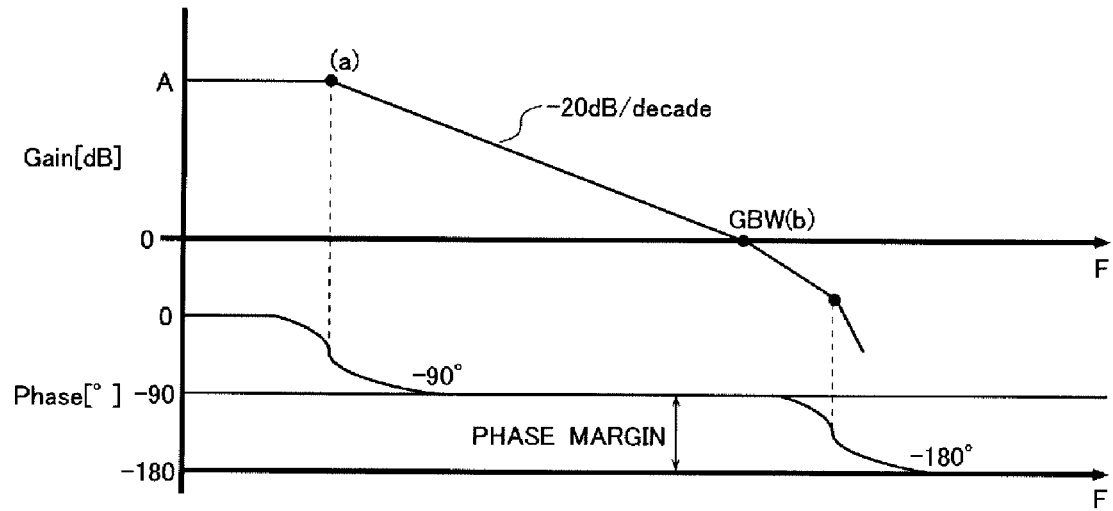
FIG. 17 is an open-loop characteristic diagram for the integrator.

FIG. 16 is a circuit diagram showing a common integrator (low-pass filter), and FIG. 17 is an open-loop characteristic diagram for the integrator. At point (a) of FIG. 17, the frequency fa=$1/2\pi RCA$ [Hz], and at point (b), the frequency fb=GBW=$1/2\pi RC$ [Hz]. Such phase compensation is applied in the error amplifier, and the error amplifier is therefore equivalent to a low-pass filter. The reference symbol R in FIG. 16 refers to an arrangement of a feedback resistor in the power supply circuit X20.

Figure 18:
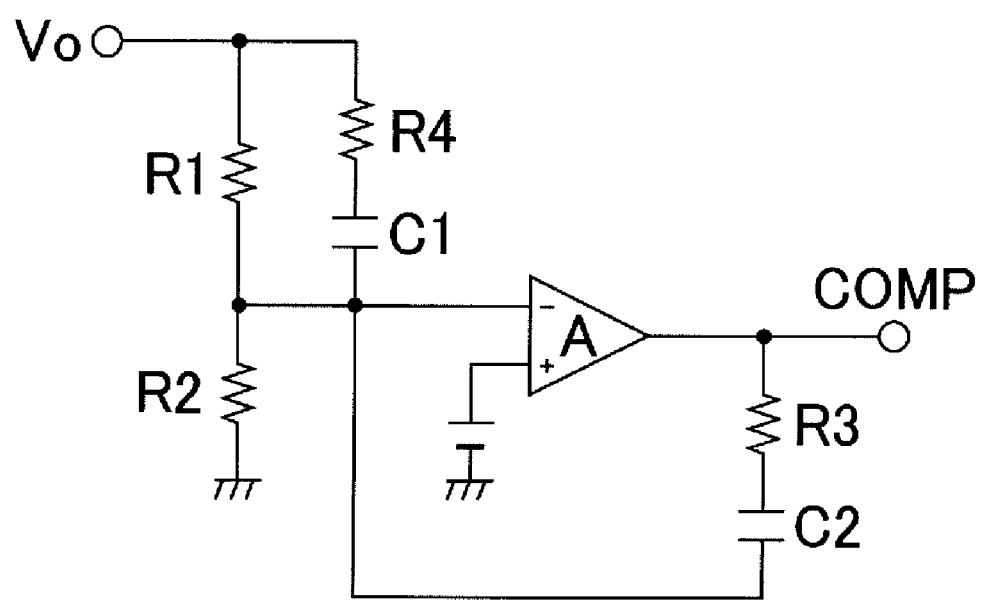
FIG. 18 is a circuit diagram showing the phase compensation method of the error amplifier.

FIG. 18 is a circuit diagram showing the phase compensation method of the error amplifier. As described above, in order to cancel out the secondary phase lag caused by LC resonance (resonance frequency fp=$1/2\pi\sqrt{LC}$ [Hz]), two phase leads (fz1=$1/2\pi C1R1$ [Hz], fz2=$1/2\pi C2R3$ [Hz]) must be inserted.

<Other Modifications>

Besides the embodiments described above, various modifications may be added to the configuration of the present invention within the intended scope of the invention. Specifically, the above embodiments are described merely as examples, and are not to be construed as limiting. The technical scope of the present invention is defined by the claims and not by the description of the embodiments given above, and all modifications are included which are equivalent to the claims in meaning and scope.

INDUSTRIAL APPLICABILITY

The antenna driving device of the present invention can be used in a smart entry system, tire pressure monitoring system, or other system which is equipped with an LF antenna.

LIST OF REFERENCE NUMERALS

1 ANTENNA DRIVING DEVICE
2 ANTENNA LOAD
3 TRAPEZOIDAL-WAVE GENERATING CIRCUIT
11 CAPACITOR
12, 13 DIRECT-CURRENT SOURCEs
14 SELECTOR
15 UPPER/LOWER CLAMP
20 BUFFER AMPLIFIER
30 PHASE INVERTING CIRCUIT
31 OPERATIONAL AMPLIFIER
32, 33 RESISTORs
40 First Differential Amplifying Circuit
41 OPERATIONAL AMPLIFIER
42, 43, 44, 45 RESISTORs
50 Second Differential Amplifier Circuit
51 OPERATIONAL AMPLIFIER
52, 53, 54, 55 RESISTORs
60 Bias Voltage Generating Circuit
61 BUFFER AMPLIFIER
62, 63 RESISTORs
70 TRAPEZOIDAL-WAVE SLOPE SETTING CIRCUIT
71 OPERATIONAL AMPLIFIER
72 NPN-TYPE BIPOLAR TRANSISTOR
73 DIRECT-CURRENT VOLTAGE SOURCE
74 CHARGING/DISCHARGING CURRENT SETTING UNIT
75 EXTERNAL RESISTOR
Q1, Q2, Q3 PNP-TYPE BIPOLAR TRANSISTOR
Q4, Q5 NPN-TYPE BIPOLAR TRANSISTOR
N1 N-CHANNEL MOS FIELD EFFECT TRANSISTOR
X ANTENNA DRIVING DEVICE
X10 ANTENNA DRIVING CIRCUIT
X20 POWER SUPPLY CIRCUIT
X21 OVERCURRENT PROTECTION CIRCUIT (FOR THE POWER SUPPLY CIRCUIT)
X22 PHASE COMPENSATING CIRCUIT (FOR THE POWER SUPPLY CIRCUIT)
X30 OSCILLATING CIRCUIT
X40 POWER SUPPLY PROTECTION CIRCUIT

What is claimed is:

1. An antenna driving device comprising:
a trapezoidal-wave signal generating circuit for generating a trapezoidal-wave signal from a rectangular-wave signal having a predetermined frequency; and
a trapezoidal-wave signal amplifying circuit for amplifying said trapezoidal-wave signal and feeding the amplified signal to an antenna load, wherein
the trapezoidal-wave signal generating circuit comprises:
a capacitor;
a first current source for providing a first current to the capacitor;
a second current source for obtaining a second current from the capacitor; and
a selector having a first selection terminal connected to the first current source, a second selection terminal connected to the second current source, a shared terminal connected to the capacitor, and a control terminal connected to an input terminal for the rectangular-wave signal.

2. The antenna driving device according to claim 1, further comprising:
a trapezoidal-wave slope setting circuit for variably setting the slope of said trapezoidal-wave signal.

3. The antenna driving device according to claim 2, wherein
said trapezoidal-wave signal generating circuit generates said trapezoidal-wave signal by charging and discharging the capacitor in accordance with said rectangular-wave signal; and
said trapezoidal-wave slope setting circuit variably sets the charging/discharging current of said capacitor.

4. The antenna drive device according to claim 1, wherein
said trapezoidal-wave signal amplifying circuit feeds a positive-phase output signal and a negative-phase output signal having mutually opposite phases to both terminals of said antenna load.

5. An antenna driving device comprising:
a power supply circuit for generating a desired output voltage from an input voltage; and
an antenna driving circuit for receiving said output voltage and driving an antenna load; wherein said antenna driving circuit comprises:
a trapezoidal-wave signal generating circuit for generating a trapezoidal-wave signal from a rectangular-wave signal having a predetermined frequency; and
a trapezoidal-wave signal amplifying circuit for amplifying said trapezoidal-wave signal and feeding the amplified signal to an antenna load, wherein the trapezoidal-wave signal generating circuit comprises:
a capacitor;
a first current source for providing a first current to the capacitor;
a second current source for obtaining a second current from the capacitor; and
a selector having a first selection terminal connected to the first current source, a second selection terminal connected to the second current source, a shared terminal connected to the capacitor, and a control terminal connected to an input terminal for the rectangular-wave signal.

6. The antenna driving device according to claim 5, wherein
said power supply circuit comprises an overcurrent protection circuit.

7. The antenna driving device according to claim 5, further comprising an oscillating circuit for generating said rectangular-wave signal.

8. The antenna driving device according to claim 5, further comprising a power supply protection circuit for preventing malfunctioning of said power supply circuit.

9. The antenna driving device according to claim 5, wherein said antenna driving circuit switches between an H-bridge driving scheme and a half-bridge driving scheme in accordance with a predetermined control signal.

10. The antenna driving device according to claim 5, wherein said power supply circuit comprises a phase compensating circuit for phase-compensating, an output feedback loop.

11. The antenna driving device according to claim 5, wherein
output operation in said power supply circuit is allowed after a predetermined time has elapsed from introduction of said input voltage; and
output operation in said antenna driving circuit is allowed once said output voltage has stabilized, and a driving scheme and a driving channel are established by the time the output operation is allowed.

12. The antenna driving device according to claim 5, wherein said antenna driving circuit variably sets the slope of said trapezoidal-wave signal on the basis of an external resistance.

13. The antenna driving device according to claim 5, wherein the constant of a coil in said power supply circuit is set so as to satisfy IINMAX+$\Delta$IL/2<ILR, where $\Delta$IL is the ripple component of the current flowing to the coil of an output stage of the power supply circuit, ILR is the rated current, and IINMAX is the maximum input current.

14. The antenna driving device according to claim 5, wherein said power supply circuit generates said output voltage so that a feedback voltage obtained by resistance-dividing said output voltage matches a predetermined reference voltage.

15. The antenna driving device according to claim 5, wherein said power supply circuit is designed so that the phase lag at a gain of 0 dB is 150° or less, and the frequency at a gain of 0 dB is $\frac{1}{10}$ the switching frequency or lower.

16. An antenna driving device comprising:
a trapezoidal-wave signal generating circuit for generating a trapezoidal-wave signal from a rectangular-wave signal having a predetermined frequency;
a trapezoidal-wave signal amplifying circuit for amplifying the trapezoidal-wave signal and feeding the amplified signal to an antenna load; and a trapezoidal-wave slope setting circuit for variably setting the slope of the trapezoidal-wave signal.

17. The antenna driving device according to claim 16, wherein
the trapezoidal-wave signal generating circuit generates the trapezoidal-wave signal by charging and discharging a capacitor in accordance with the rectangular-wave signal; and
the trapezoidal-wave slope setting circuit variably sets the charging/discharging current of the capacitor.

18. The antenna, driving device according to claim 17, wherein the trapezoidal-wave slope setting circuit comprises:
a first current mirror for generating a first mirror current in accordance with a slope setting current; and
a second current mirror for generating a second mirror current in accordance with the slope setting current;
wherein the trapezoidal-wave signal generating circuit comprises:
the capacitor;
a first direct-current current source for providing the first mirror current to the capacitor;
a second direct-current current source for obtaining the second mirror current from the capacitor; and
a switch for controlling the on/off state of the second current mirror in accordance with the rectangular-wave signal.

19. An antenna driving device comprising:
a power supply circuit for generating a desired output voltage from an input voltage; and
an antenna driving circuit for receiving said output voltage and driving an antenna load;
wherein the antenna driving circuit comprises:
a trapezoidal-wave signal generating circuit for generating a trapezoidal-wave signal from a rectangular-wave signal having a predetermined frequency; and
a trapezoidal-wave signal amplifying circuit for amplifying the trapezoidal-wave signal and feeding the amplified signal to an antenna load,
wherein the antenna driving circuit switches between an H-bridge driving scheme and a half-bridge driving scheme in accordance with a predetermined control signal.

20. An antenna driving device comprising:
a power supply circuit for generating a desired output voltage from an input voltage; and
an antenna driving circuit for receiving the output voltage and driving an antenna load;
wherein the antenna driving circuit comprises:
a trapezoidal-wave signal generating circuit for generating a trapezoidal-wave signal from a rectangular-wave signal having a predetermined frequency; and
a trapezoidal-wave signal amplifying circuit for amplifying the trapezoidal-wave signal and feeding the amplified signal to an antenna load, wherein the antenna driving circuit variably sets the slope of said trapezoidal-wave signal on the basis of an external resistance.

21. An antenna driving device comprising:
a power supply circuit for generating a desired output voltage from an input voltage; and
an antenna driving circuit for receiving the output voltage and driving an antenna load;
wherein the antenna driving circuit comprises:
a trapezoidal-wave signal generating circuit for generating a trapezoidal-wave signal from a rectangular-wave signal having a predetermined frequency; and a trapezoidal-wave signal amplifying circuit for amplifying the trapezoidal-wave signal and feeding the amplified signal to an antenna load, wherein the power supply circuit is arranged so that the phase lag at a gain of 0 dB is 150° or less, and the frequency at a gain of 0 dB is 1/10 the switching frequency or lower.

* * * * *